(12) United States Patent
Loeppert et al.

(10) Patent No.: US 11,540,048 B2
(45) Date of Patent: Dec. 27, 2022

(54) REDUCED NOISE MEMS DEVICE WITH FORCE FEEDBACK

(71) Applicant: Knowles Electronics, LLC, Itasca, IL (US)

(72) Inventors: Peter V. Loeppert, Durand, IL (US); Michael Pedersen, Long Grove, IL (US); Vahid Naderyan, Chicago, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 83 days.

(21) Appl. No.: 17/232,566

(22) Filed: Apr. 16, 2021

(65) Prior Publication Data
US 2022/0337947 A1 Oct. 20, 2022

(51) Int. Cl.
*H04R 3/02* (2006.01)
*H04R 19/04* (2006.01)
(Continued)

(52) U.S. Cl.
CPC ............ *H04R 3/02* (2013.01); *B81B 7/008* (2013.01); *H04R 1/025* (2013.01); *H04R 3/04* (2013.01);
(Continued)

(58) Field of Classification Search
CPC . H04R 3/02; H04R 1/025; H04R 3/04; H04R 7/06; H04R 19/04; H04R 2201/003;
(Continued)

(56) References Cited

U.S. PATENT DOCUMENTS

| 4,154,115 A | 5/1979 | Hartung et al. |
| 4,435,986 A | 3/1984 | Choffat |

(Continued)

FOREIGN PATENT DOCUMENTS

| CN | 103344377 A | 10/2013 |
| CN | 106162476 A | 11/2016 |

(Continued)

OTHER PUBLICATIONS

U.S. Appl. No. 17/037,959 for application entitled "Sub-Miniature Microphone," Applicant: Knowles Electronics LLC, filed Sep. 30, 2020.

(Continued)

*Primary Examiner* — Matthew A Eason
*Assistant Examiner* — Kuassi A Ganmavo
(74) *Attorney, Agent, or Firm* — Flener IP & Business Law; Zareefa B. Flener; Ayhan Mertogul

(57) ABSTRACT

A microelectromechanical systems (MEMS) device comprises a diaphragm assembly and a force feedback system. The diaphragm assembly includes a first diaphragm and a second diaphragm facing the first diaphragm, with a low pressure region being defined therebetween. The diaphragm assembly further includes a first plurality of electrodes, a second plurality of electrodes, and a third plurality of electrodes. A solid dielectric is spaced between the first and second diaphragms and includes a plurality of apertures. Each electrode of the first, second, and third pluralities of electrodes is disposed at least partially within an aperture of the plurality of apertures. The force feedback system receives output from the diaphragm assembly and produces a feedback voltage that is applied to the diaphragm assembly to produce an electrostatic force on the diaphragm assembly that counters a low-frequency pressure across the diaphragm assembly.

22 Claims, 7 Drawing Sheets

(51) Int. Cl.
 *H04R 7/06* (2006.01)
 *H04R 3/04* (2006.01)
 *H04R 1/02* (2006.01)
 *B81B 7/00* (2006.01)

(52) U.S. Cl.
 CPC .............. *H04R 7/06* (2013.01); *H04R 19/04* (2013.01); *B81B 2201/0257* (2013.01); *B81B 2203/0127* (2013.01); *B81B 2203/04* (2013.01); *B81B 2207/03* (2013.01); *H04R 2201/003* (2013.01)

(58) Field of Classification Search
 CPC .................. H04R 19/005; B81B 7/008; B81B 2201/0257; B81B 2203/0127; B81B 2203/04; B81B 2207/03
 See application file for complete search history.

(56) References Cited

U.S. PATENT DOCUMENTS

| | | | |
|---|---|---|---|
| 6,075,867 A | 6/2000 | Bay et al. | |
| 6,431,003 B1 | 8/2002 | Stark et al. | |
| 6,435,033 B2 | 8/2002 | Delaye | |
| 6,535,460 B2 | 3/2003 | Loeppert et al. | |
| 6,571,445 B2 | 6/2003 | Ladabaum | |
| 6,662,663 B2 | 12/2003 | Chen | |
| 7,030,407 B2 | 4/2006 | Michler | |
| 7,040,173 B2 | 5/2006 | Dehe | |
| 7,124,638 B2 | 10/2006 | Kandler | |
| 7,150,195 B2 | 12/2006 | Jacobsen et al. | |
| 7,190,038 B2 | 3/2007 | Dehe et al. | |
| 7,470,546 B2 | 12/2008 | Lehmann | |
| 7,489,593 B2 | 2/2009 | Nguyen-Dinh et al. | |
| 7,535,156 B2 | 5/2009 | Kvisteroy et al. | |
| 7,545,012 B2 | 6/2009 | Smith et al. | |
| 7,781,249 B2 | 8/2010 | Laming et al. | |
| 7,793,550 B2 | 9/2010 | Elian et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,903,831 B2 | 3/2011 | Song | |
| 7,918,135 B2 | 4/2011 | Hammerschmidt | |
| 8,127,619 B2 | 3/2012 | Hammerschmidt | |
| 8,339,764 B2 | 12/2012 | Steeneken et al. | |
| 8,461,655 B2 | 6/2013 | Klein et al. | |
| 8,575,037 B2 | 11/2013 | Friza et al. | |
| 8,650,963 B2 | 2/2014 | Barr et al. | |
| 8,723,277 B2 | 5/2014 | Dehe et al. | |
| 8,809,973 B2 | 8/2014 | Theuss | |
| 8,969,980 B2 | 3/2015 | Lee | |
| 8,989,411 B2 | 3/2015 | Hall et al. | |
| 9,031,266 B2 | 5/2015 | Dehe et al. | |
| 9,179,221 B2 | 11/2015 | Barzen et al. | |
| 9,181,080 B2 | 11/2015 | Dehe et al. | |
| 9,237,402 B2 | 1/2016 | Loeppert | |
| 9,321,630 B2 | 4/2016 | Xu et al. | |
| 9,332,330 B2 | 5/2016 | Elian et al. | |
| 9,380,381 B2 | 6/2016 | Straeussnigg et al. | |
| 9,383,282 B2 | 7/2016 | Besling et al. | |
| 9,383,285 B2 | 7/2016 | Phan Le et al. | |
| 9,425,757 B2 | 8/2016 | Straeussnigg et al. | |
| 9,432,759 B2 | 8/2016 | Elian et al. | |
| 9,438,979 B2 | 9/2016 | Dehe | |
| 9,510,107 B2 | 11/2016 | Dehe et al. | |
| 9,516,428 B2 | 12/2016 | Dehe et al. | |
| 9,549,263 B2 | 1/2017 | Uchida | |
| 9,550,211 B2 | 1/2017 | Dirksen et al. | |
| 9,631,996 B2 | 4/2017 | Wiesbauer et al. | |
| 9,689,770 B2 | 6/2017 | Hammerschmidt | |
| 9,828,237 B2 | 11/2017 | Walther et al. | |
| 9,884,757 B2 | 2/2018 | Winkler et al. | |
| 9,903,779 B2 | 2/2018 | Hammerschmidt | |
| 9,942,677 B2 | 4/2018 | Wiesbauer et al. | |
| 10,129,676 B2 | 11/2018 | Walther et al. | |
| 10,231,061 B2 | 3/2019 | Dehe et al. | |
| 10,322,481 B2 | 6/2019 | Dehe et al. | |
| 10,433,070 B2 | 10/2019 | Dehe et al. | |
| 10,560,771 B2 | 2/2020 | Dehe et al. | |
| 10,582,306 B2 | 3/2020 | Dehe | |
| 10,589,990 B2 | 3/2020 | Dehe et al. | |
| 10,641,626 B2 | 5/2020 | Bretthauer et al. | |
| 10,669,151 B2 | 6/2020 | Strasser et al. | |
| 10,676,346 B2 | 6/2020 | Walther et al. | |
| 10,689,250 B2 | 6/2020 | Fueldner et al. | |
| 10,715,926 B2 | 7/2020 | Bretthauer et al. | |
| 10,939,214 B2 | 3/2021 | Kuntzman et al. | |
| 2002/0132113 A1* | 9/2002 | Tanaka .................. G01P 15/125 428/343 |
| 2005/0177045 A1 | 8/2005 | Degertekin et al. | |
| 2005/0207605 A1 | 9/2005 | Dehe et al. | |
| 2005/0219953 A1 | 10/2005 | Bayram et al. | |
| 2007/0205492 A1 | 9/2007 | Wang | |
| 2007/0278501 A1 | 12/2007 | Macpherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0175477 A1 | 7/2009 | Suzuki et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0170346 A1 | 7/2010 | Opitz et al. | |
| 2010/0173437 A1 | 7/2010 | Wygant et al. | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0051575 A1* | 3/2012 | Akino .................... H04R 19/04 381/174 |
| 2013/0001550 A1 | 1/2013 | Seeger et al. | |
| 2014/0071642 A1 | 3/2014 | Theuss | |
| 2014/0109680 A1* | 4/2014 | Tsai ...................... G01L 9/0072 73/702 |
| 2015/0001647 A1* | 1/2015 | Dehe ...................... H04R 31/00 257/416 |
| 2015/0090043 A1 | 4/2015 | Ruhl et al. | |
| 2015/0247879 A1 | 9/2015 | Meinhold | |
| 2015/0296307 A1 | 10/2015 | Shao et al. | |
| 2016/0096726 A1 | 4/2016 | Dehe et al. | |
| 2018/0091906 A1 | 3/2018 | Khenkin et al. | |
| 2018/0146296 A1* | 5/2018 | Meisel .................... H04R 9/08 |
| 2018/0152798 A1* | 5/2018 | Thomsen ................ H04R 3/06 |
| 2018/0194615 A1* | 7/2018 | Nawaz .................. B81B 7/0032 |
| 2018/0234774 A1 | 8/2018 | Walther et al. | |
| 2018/0317022 A1 | 11/2018 | Evans et al. | |
| 2019/0112182 A1 | 4/2019 | Metzger-Brueckl et al. | |
| 2019/0181776 A1 | 6/2019 | Tumpold et al. | |
| 2019/0246459 A1 | 8/2019 | Tumpold et al. | |
| 2019/0270639 A1 | 9/2019 | Lorenz et al. | |
| 2019/0331531 A1 | 10/2019 | Glacer et al. | |
| 2019/0339193 A1 | 11/2019 | Eberl et al. | |
| 2019/0352175 A1 | 11/2019 | Tumpold et al. | |
| 2019/0363757 A1 | 11/2019 | Mikolajczak et al. | |
| 2020/0057031 A1 | 2/2020 | Theuss et al. | |
| 2021/0120323 A1 | 4/2021 | Naderyan et al. | |

FOREIGN PATENT DOCUMENTS

| | | |
|---|---|---|
| CN | 206212271 U | 5/2017 |
| CN | 108551646 A | 9/2018 |
| CN | 110115048 A | 9/2019 |
| KR | 100571967 B1 | 4/2006 |

(56) References Cited

FOREIGN PATENT DOCUMENTS

WO    2012085335 A1    6/2012
WO    2019183283 A2    9/2019

OTHER PUBLICATIONS

U.S. Appl. No. 17/111,465 for application entitled "MEMS Device With Electrodes and a Dielectric," Applicant: Knowles Electronics LLC, filed Dec. 3, 2020.
Andrews et al., "A comparison of squeeze-film theory with measurements on a microstructure," Sensors and Actuators A 36 (1993) 79-87, 9 pages.
Bay et al., "Design of a silicon microphone with differential read-out of a sealed double parallel-plate capacitor," Sensors and Acutators A 53 (1996), pp. 232-236, 5 pages.
Hansen et al., "Wideband micromachined capacitive microphones with radio frequency detection," J. Acoust. Soc. Am. 116 (2), Aug. 2004, pp. 828-842, 15 pages.
Lin, Der-Song, "Interface Engineering of Capacitive Micromachined Ultrasonic Transducers for Medical Applications," A Dissertation Submitted to the Department of Mechanical Engineering and the Committee on Graduate Studies of Stanford University in Partial Fulfillment of the Requirements for the Degree of Doctor of Philosophy, Jun. 2011, 168 pages.
Park et al., "Fabrication of Capacitive Micromachined Ultrasonic Transducers via Local Oxidation and Direct Water Bonding," Journal of Microelectromechanical Systems, vol. 20, No. 1, Feb. 2011, 10 pages.
Krzysztof Iniewski, "Smart Sensors for Industrial Applications," Figure 19. 1, p. 306, 1 page (2013).
Wygant et al., "50 kHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

\* cited by examiner

US 11,540,048 B2

REDUCED NOISE MEMS DEVICE WITH FORCE FEEDBACK

FIELD OF THE DISCLOSURE

The present disclosure relates generally to a reduced noise microelectromechanical systems (MEMS) device, and more particularly to a MEMS device having a reduced noise structure and a force feedback system.

BACKGROUND

MEMS devices are used in a variety of applications. For example, many types of acoustic sensors include a MEMS die having a diaphragm and a backplate and an integrated circuit, in which relative movement between the backplate and the diaphragm causes a change in capacitance, which is detected by the integrated circuit and ultimately interpreted as sound. As with any acoustic sensor, it is usually a design goal to minimize noise.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
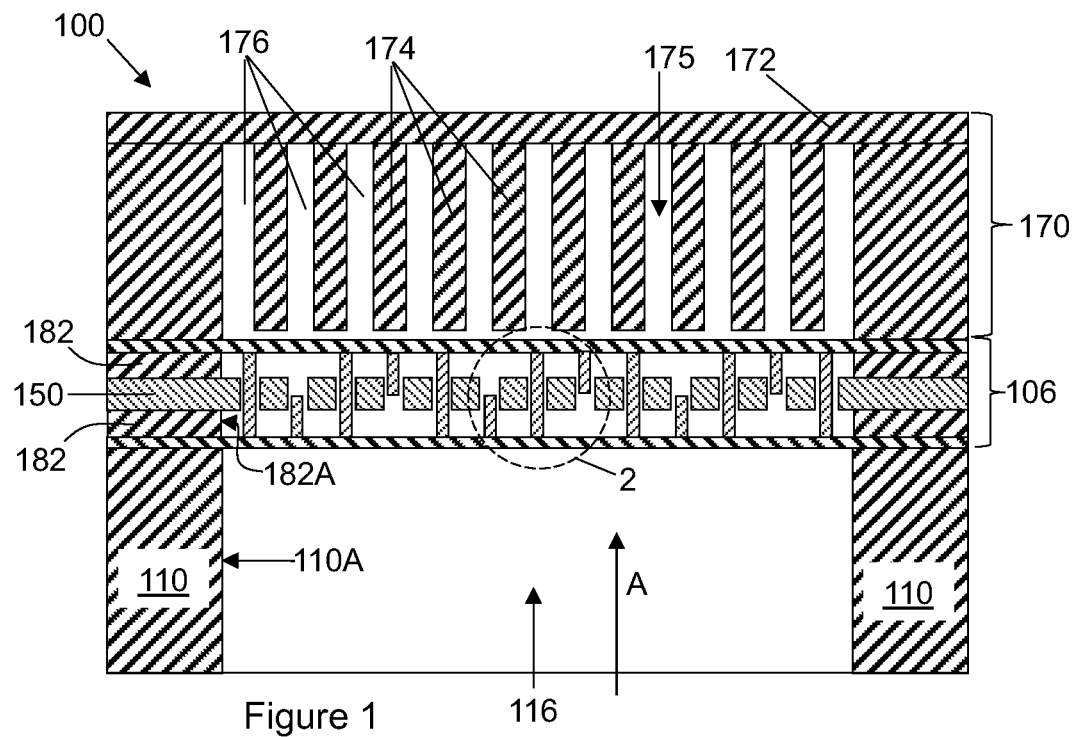
FIG. 1 is a cross-sectional schematic view of a MEMS die, according to an embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to various embodiments described herein, a MEMS die can include a dual diaphragm having one or more pluralities of electrodes disposed within a low pressure region disposed between the diaphragms, for example, as shown in U.S. application Ser. No. 17/133,506, filed on Dec. 23, 2020 and hereby incorporated in its entirety herein. Such a diaphragm structural arrangement can be useful in reducing acoustic damping noise associated with air typically within a MEMS structure. MEMS dies having a miniaturized back volume for reducing thermal boundary layer noise in the back volume are shown in U.S. application Ser. No. 17/037,959, filed on Sep. 30, 2020 and hereby incorporated in its entirety herein. A MEMS die constructed from a combination of a low pressure diaphragm structure and a miniaturized back volume and used, for example, as a transducer, may still produce acoustic noise that can be reduced using various embodiments described herein.

According to an embodiment, a microelectromechanical systems (MEMS) device comprises a diaphragm assembly and an enclosure disposed on a side of the diaphragm assembly, which includes a first diaphragm, a second diaphragm facing the first diaphragm, with a low pressure region being defined therebetween. The diaphragm assembly further includes a first plurality of electrodes, each of the first plurality having a first end connected to a first side of the first diaphragm and a second end connected to the second diaphragm, a second plurality of electrodes, each of the second plurality having a first end connected to the first diaphragm and a free second end, and a third plurality of electrodes, each of the third plurality having a free first end and a second end connected to the second diaphragm. A solid dielectric is spaced between the first and second diaphragms and includes a plurality of apertures. Each electrode of the first, second, and third pluralities of electrodes is disposed at least partially within an aperture of the plurality of apertures, and the dielectric surrounds the second ends of each of the second plurality of electrodes and the first ends of each of the third plurality of electrodes. The MEMS device further includes a force feedback system that receives output from the diaphragm assembly and produces a feedback voltage that is applied to the diaphragm assembly to produce an electrostatic force on the diaphragm assembly that counters a low-frequency pressure across the diaphragm assembly.

In an embodiment, the MEMS device includes an enclosure that is disposed on a second side of the first diaphragm opposite the first side. The enclosure bounds a back volume in which all points within the back volume are less than a single thermal boundary layer thickness from a nearest surface of the enclosure.

According to an embodiment, the MEMS device further comprises a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

In an embodiment, the MEMS device further includes a force feedback system comprising a differential amplifier. The force feedback system further includes a first electrical connection between the first ends of at least a first subset of the second plurality of electrodes and a first input to the differential amplifier, and a second electrical connection between the second ends of at least a first subset of the third plurality of electrodes and a second input to the differential amplifier. A frequency filter circuit is included having an input connected to an output of the differential amplifier. The force feedback system further includes a feedback amplifier having an input connected to an output of the frequency filter circuit and an output connected to a second subset of the first plurality of electrodes not connected to the voltage source. Motion of the diaphragm assembly in response to pressure produces a voltage signal at an output of the differential amplifier, the voltage signal is filtered by the frequency filter circuit to select a portion of the signal below a predetermined frequency, and the selected portion of the signal is provided to the feedback amplifier to produce a feedback voltage that is applied to the second subset of the first plurality of electrodes. The feedback voltage produces an electrostatic force on the diaphragm assembly counter to the force of the pressure.

Turning to FIG. 1, a MEMS die according to an embodiment is shown schematically in cross-section. The MEMS die, generally labelled 100, includes a substrate 110 having an opening 116 formed therein. In an embodiment the substrate 110 is an rectangular solid but in other embodiments it can be any shape. In an embodiment a diaphragm assembly 106 is attached around a periphery thereof to the substrate 110 and over the opening 116. Opening 116 is typically round but can be any shape. In an embodiment the substrate 110 is made of silicon.

Figure 2:
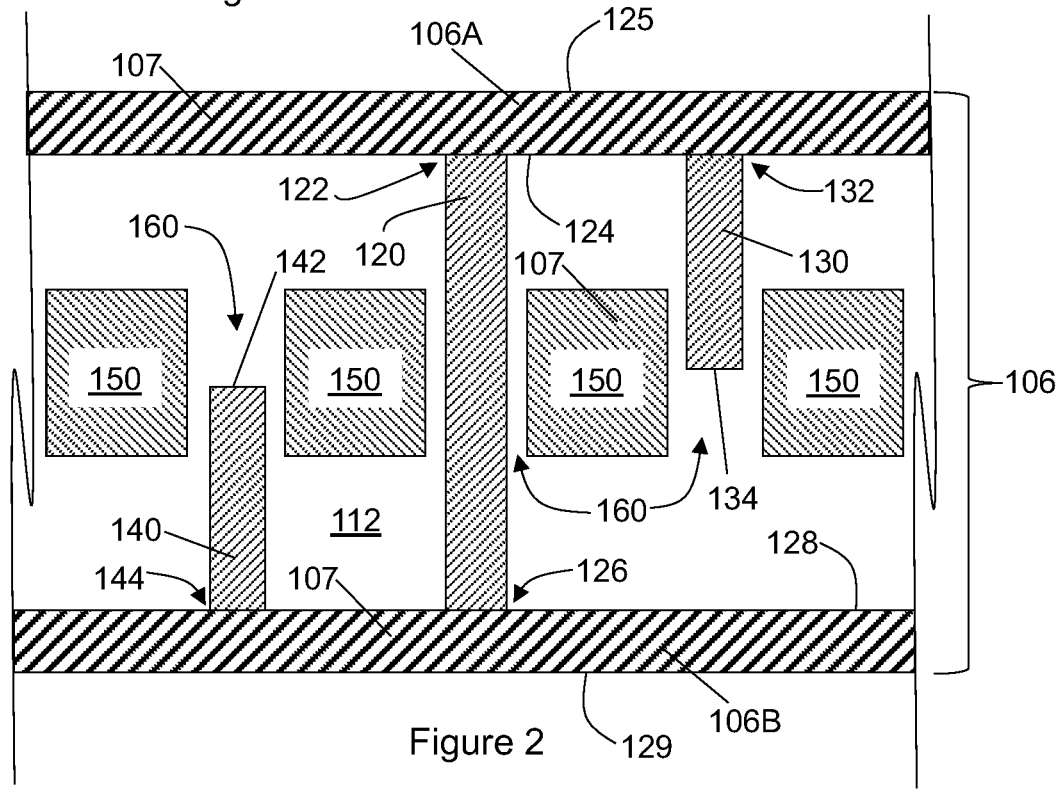
FIG. 2 is a cross-sectional schematic view of the MEMS die of FIG. 1, illustrating an expanded view of the portion of FIG. 1 within the dashed circle 2.

Referring to FIG. 2, a portion of the MEMS die 100 of FIG. 1 is illustrated somewhat enlarged. The diaphragm assembly 106 in an embodiment comprises a first diaphragm 106A having a first side 124 and a second side 125. The diaphragm assembly 106 further comprises a second diaphragm 106B having a first side 128 facing the first side 124 of the first diaphragm 106A and a second side 129 facing away from the first diaphragm 106A. A low pressure region is defined in a space 112 between the first side 124 of the first diaphragm 106A and the first side 128 of the second diaphragm 106B. The low pressure region in an embodiment has a pressure of less than about 0.003 atmosphere. In another embodiment the low pressure region has a pressure less than about 0.001 atmosphere.

In an embodiment, a first plurality of electrodes 120 is disposed between the first and second diaphragms 106A and 106B. Each of the first plurality 120 of electrodes has a first end 122 connected to the first side 124 of the first diaphragm 106A and a second end 126 connected to the first side 128 of the second diaphragm 106B. The diaphragm assembly 106 in an embodiment further comprises a second plurality of electrodes 130 disposed between the first and second diaphragms 106A and 106B. Each of the second plurality 130 of electrodes has a first end 132 connected to the first side 124 of the first diaphragm 106A and a free second end 134. In an embodiment the diaphragm assembly 106 further includes a third plurality of electrodes 140 disposed between the first and second diaphragms 106A and 106B. Each of the third plurality 140 of electrodes has a free first end 142 and a second end 144 connected to the first side 128 of the second diaphragm 106B.

Still referring to FIG. 2, in an embodiment, a solid dielectric 150 is spaced between the first and second diaphragms 106A and 106B, and includes a plurality of apertures 160. Each electrode of the first 120, second 130, and third 140 pluralities of electrodes is disposed at least partially within an aperture of the plurality of apertures 160. The solid dielectric 150 surrounds the second ends 134 of each of the second plurality 130 of electrodes and the first ends 142 of each of the plurality of third electrodes 140. The first 120, second 130, and third 140 pluralities of electrodes can be cylinders, plates, cuboids, prisms, polyhedrons, or other shapes of electrodes, and can be made of any conductive material.

In an embodiment each of the first and second diaphragms 106A and 106B and the solid dielectric 150 comprises at least an insulative layer of material 107. The insulative material 107 can be any insulative material as known in the art that would not be damaged during a sacrificial layer removal process. For example, without limitation, the insulative material 107 can be silicon nitride, silicon oxynitride, metal oxides, polymers, materials that are not damaged by a sacrificial layer removal process, and combinations thereof.

Referring again to FIG. 1, in an embodiment the solid dielectric 150 is disposed with its periphery attached between the first and second diaphragms 106A and 106B by means of spacer layers 182. In an embodiment, the periphery of the second diaphragm 106B is further attached to the substrate 110 by means of a spacer layer 184 (not shown in FIG. 1—see FIG. 5). In an embodiment the first diaphragm layer 106A is attached to an enclosure 170 defining a back volume 175 (see below). The attachment between the first diaphragm layer 106A and the enclosure 170 in an embodiment is a direct attachment as shown in FIG. 1. In another embodiment the attachment between the first diaphragm layer 106A and the enclosure 170 is via an optional spacer layer (not shown but like for example, the spacer layer 184 shown in FIG. 5).

In an embodiment, both the diaphragm assembly 106 and the solid dielectric 150 are circular in a plan view (as viewed along the arrow labeled A in FIG. 1) but in other embodiments can be any shape. In an embodiment the spacer layers 182 have a curved interior wall 182A. The substrate 110 also has a curved interior wall 110A, which defines the opening 116 that extends through the substrate 110 to the surrounding environment. The spacers 182, 184 are made of any insulative material 107 as described hereinabove.

In an embodiment, the solid dielectric 150 is relatively thick and stiff compared to the first and second diaphragms 106A and 106B and remains relatively motionless when the first and second diaphragms 106A and 106B are deflected. Deflection of the first and second diaphragms 106A and 106B moves the first, second, and third pluralities of electrodes 120, 130, 140 relative to the solid dielectric 150.

In an embodiment the solid dielectric 150 has a thickness of about 3 microns; however, in other embodiments the solid dielectric 150 can have a thickness in a range between about 1 micron and about 10 microns. Further, in an embodiment the solid dielectric has holes that are cylindrically shaped and about 3 microns in diameter; however, in other embodiments the holes can have any cross-sectional shape and/or can have a largest cross-sectional dimension in a range between about 0.6 microns and about 6 microns. In an embodiment the spacers 182, 184 have a thickness of about 1.5 microns; however, in other embodiments the spacers 182, 184 can have a thickness in a range between about 0.1 micron and about 10 microns. The first and second diaphragms 106A and 106B in an embodiment are about 0.5 micron thick; however, in other embodiments the first and second diaphragms 106A and 106B can have a thickness in a range between about 0.1 micron and 2 microns. The first, second, and third pluralities of electrodes 120, 130, and 140 in an embodiment are made from polycrystalline silicon and are cylindrically shaped and about 2 microns in diameter; however, in other embodiments the first, second, and third pluralities of electrodes 120, 130, and 140 can be made of other conductive materials and can have other shapes and/or have a largest cross-sectional dimension of between about 0.5 micron and 5 microns.

Figure 3:
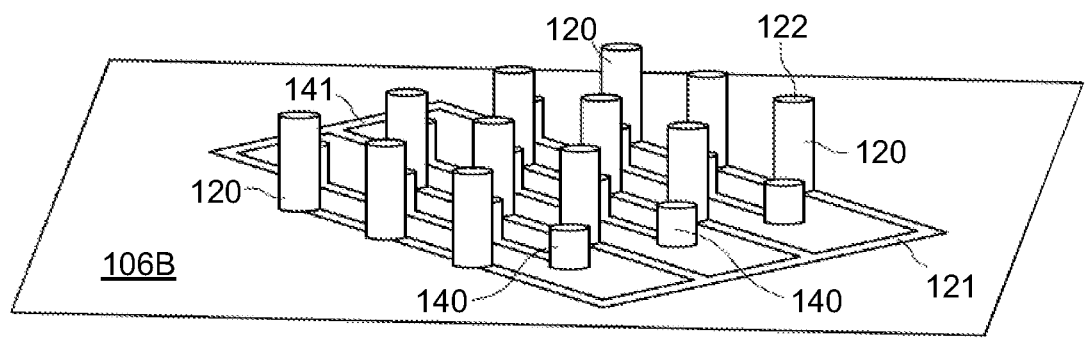
FIG. 3 is a partial cut-away schematic view of an exemplary arrangement of electrodes according to an embodiment.

Referring to FIG. 3, an exemplary arrangement of the first plurality 120 of electrodes and the third plurality 140 of electrodes is schematically illustrated with a portion of the second diaphragm 106B. As shown in FIG. 3, in an embodiment each of the first plurality 120 of electrodes is electrically connected to each other, for example, by an electrical trace or wire 121 that can be layered onto or into the second diaphragm 106B (and/or an electrical trace or wire 123 that can be layered onto or into the first diaphragm 106A—see FIG. 4). In other embodiments, each of a first subset of the first plurality 120 of electrodes is electrically connected to each other, and each of a second subset of the first plurality 120 of electrodes is connected to each other, for example by the electrical trace or wire 121 as shown in FIG. 3, but the first subset is not electrically connected to the second subset.

Similarly, still referring to FIG. 3, in an embodiment each of the third plurality 140 of electrodes is electrically connected to each other, for example, by an electrical trace or wire 141 that can be layered onto or into the second diaphragm 106B. In other embodiments, each of a first subset of the third plurality 140 of electrodes is electrically connected to each other, and each of a second subset of the third plurality 140 of electrodes is connected to each other, for example by the trace or wire 141 as shown in FIG. 3, but the first subset is not electrically connected to the second subset.

Figure 4:
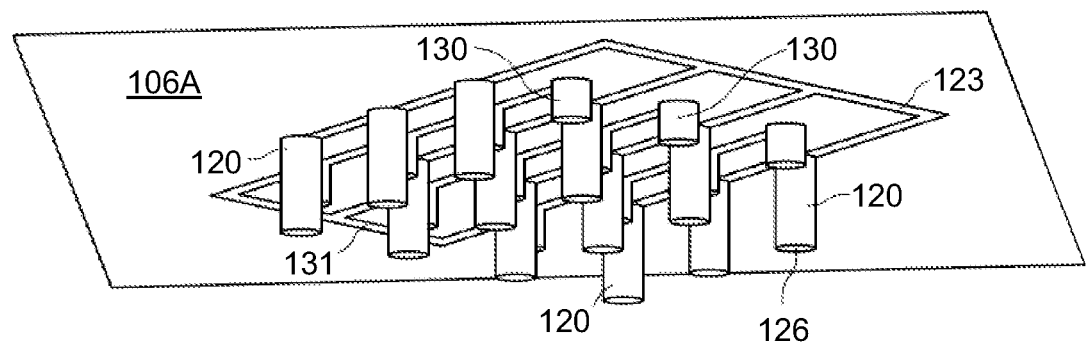
FIG. 4 is another partial cut-away schematic view of an exemplary arrangement of electrodes according to an embodiment.

Referring to FIG. 4, an exemplary arrangement of the first plurality 120 of electrodes and the second plurality 130 of electrodes is schematically illustrated with a portion of the first diaphragm 106A. As shown in FIG. 4, in an embodiment each of the first plurality 120 of electrodes is electrically connected to each other, for example, by an electrical trace or wire 123 that can be layered onto or into the first diaphragm 106A. In other embodiments, each of a first subset of the first plurality 120 of electrodes is electrically connected to each other, and each of a second subset of the first plurality 120 of electrodes is connected to each other, for example by the electrical trace or wire 123 as shown in FIG. 4, but the first subset is not electrically connected to the second subset. Similarly, still referring to FIG. 4, in an embodiment each of the second plurality 130 of electrodes is electrically connected to each other, for example, by an electrical trace or wire 131 that can be layered onto or into the first diaphragm 106A. In other embodiments, each of a first subset of the second plurality 130 of electrodes is electrically connected to each other, and each of a second subset of the second plurality 130 of electrodes is connected to each other, for example by the trace or wire 131 as shown in FIG. 4, but the first subset is not electrically connected to the second subset.

Figure 5:
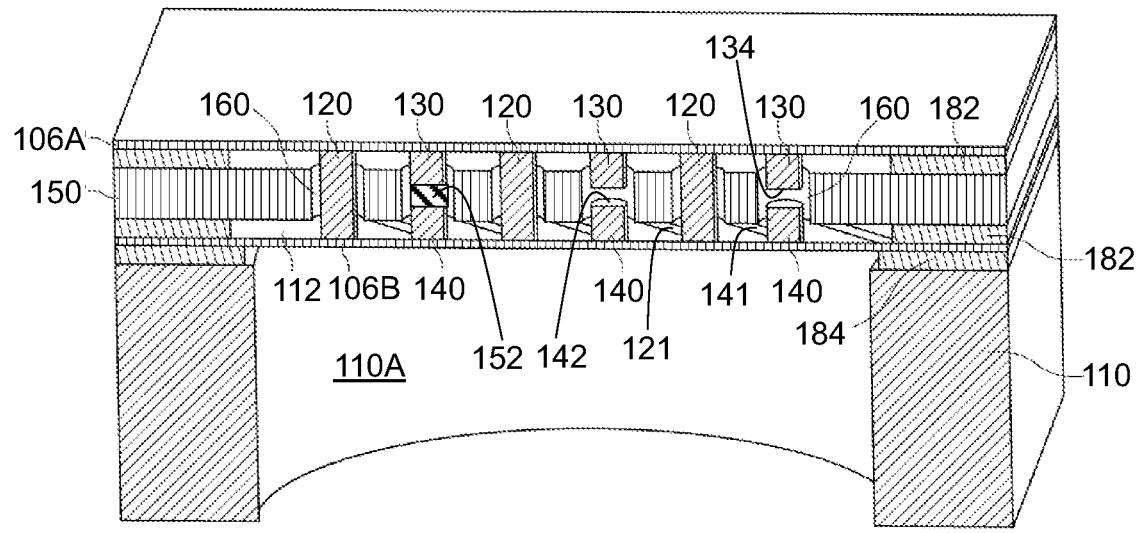
FIG. 5 is a cross-sectional schematic perspective view of a MEMS die, according to an embodiment.

Referring to FIG. 5, in an embodiment one or more of the second plurality 130 of electrodes is coaxially disposed with one or more of the third plurality 140 of electrodes. In an embodiment, the second end 134 of the one or more of the second plurality 130 of electrodes is connected by a dielectric support layer 152 to the first end 142 of the one or more of the third plurality 140 of electrodes. The dielectric support layer 152 in an embodiment is made of the same material as the solid dielectric 150.

Figure 6:
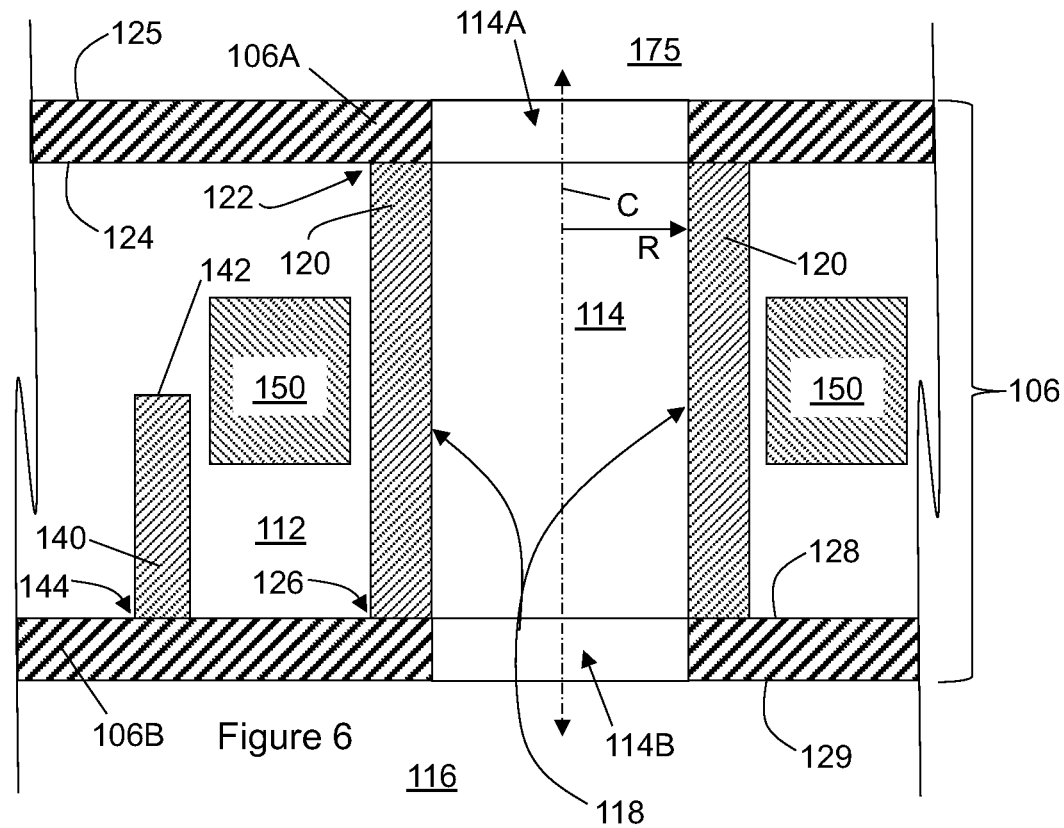
FIG. 6 is a cross-sectional schematic view of a portion of a MEMS die, showing a passage through the diaphragm assembly, according to an embodiment.

Referring to FIG. 6, in an embodiment, at least one passage 114 is disposed entirely through the diaphragm assembly 106 providing fluid communication between the opening 116 on one side of the diaphragm assembly 106 and the back volume 175 on an opposite side of the diaphragm assembly 106. In an embodiment a first pierce 114A of any cross-sectional shape as is desired or otherwise known in the art is disposed through the first diaphragm 106A and a second pierce 114B of any cross-sectional shape as is desired or otherwise known in the art is disposed through the second diaphragm 106B.

Still referring to FIG. 6, a centerline C and a radial axis R have been added for reference of the following description. In an embodiment a tunnel structure 118 is disposed entirely through the first and second diaphragms 106A and 106B. The tunnel structure 118 provides fluid communication between the second sides 125, 129 of the first and second diaphragms 106A and 106B, respectively. The tunnel structure 118 is configured to maintain the low pressure region within the space 112 disposed between the first sides 124, 128 of the first and second diaphragms 106A and 106B, respectively. For example, in an embodiment the tunnel structure 118 is sealed at a first end to the material of the diaphragm layer 106A and at a second opposite end to the material of the diaphragm layer 106B.

In an embodiment the tunnel structure 118, as shown schematically in FIG. 6, is manufactured as a solid wall of a hollow tubular structure that is one of the first plurality 120 of electrodes that connects between the first diaphragm 106A and second diaphragm 106B. The first and second pierces 114A and 114B are disposed within an interior of the walls of the hollow tubular structure. In an embodiment, the first and second pierces 114A and 114B extend over an entirety of the open ends of the tunnel structure 118. In other embodiments the first and second pierces extend over only a portion of the open ends of the tunnel structure 118 and/or are bounded by material of the first and second diaphragm layers 106A, 106B, respectively. In an embodiment the tunnel structure 118 comprises a straight cylinder; however, in other embodiments the tunnel structure can have a different shape including a varying cross-section between the open ends thereof.

The at least one passage 114 allows for pressure equalization between the back volume 175 and the surrounding environment. The at least one passage 114 is important for low-frequency roll off (LFRO) performance of the device ultimately made from the MEMS die 100, and in some embodiments there can be more than one passage 114 disposed through the diaphragm assembly 106.

Referring again to FIGS. 1 and 2, in an embodiment an enclosure 170 is disposed on a second side 125 of the first diaphragm 106A opposite the first side 124. The enclosure 170 defines a back volume 175, in which all points within the back volume 175 are less than a single thermal boundary layer thickness, $T_{b1}$ from a nearest surface of the enclosure 175. The boundary layer thickness is given by $$T_{b1} = \sqrt{\frac{2\kappa}{\omega \rho C p}}$$

where ω is the operating angular frequency of the diaphragm assembly 106, κ is the thermal conductivity, ρ is the density and $C_p$ is the specific heat at constant pressure of the gas within the back volume 175.

Figure 7:
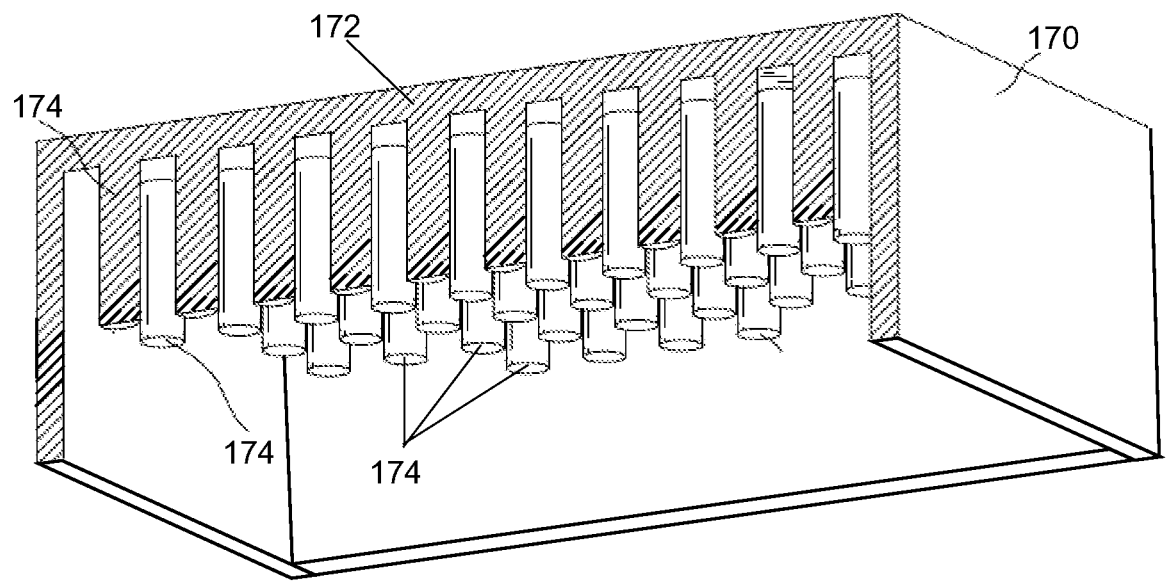
FIG. 7 is a cross-sectional schematic perspective view of an enclosure according to an embodiment.
Figure 8:
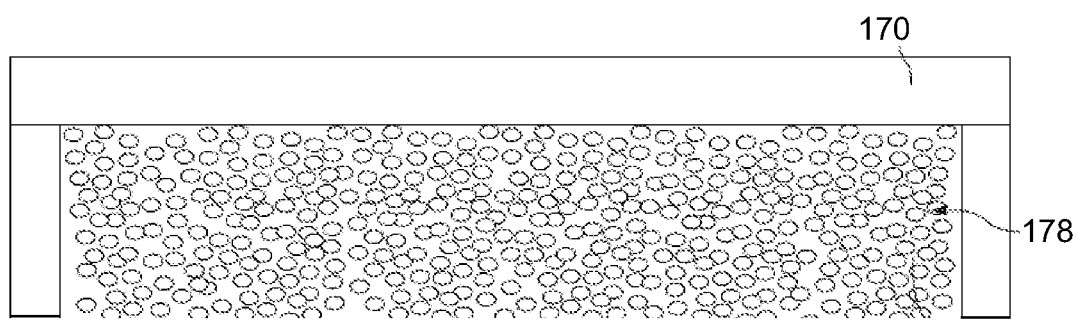
FIG. 8 is a cross-sectional schematic perspective view of an enclosure according to another embodiment.

The cross-sectional view of the enclosure 170 illustrated in FIG. 1 can represent two different embodiments of the enclosure 170. For example, in an embodiment (also see FIG. 7) the enclosure 170 comprises a back wall 172 disposed generally parallel to the diaphragm assembly 106 and plurality of elongate pillars 174 extending from the back wall 172 and oriented generally perpendicularly to the diaphragm assembly 106 (not shown in FIG. 7). In another embodiment, FIG. 1 could also represent a geometry wherein the enclosure 170 comprises a plurality of elongate channels 176 disposed therein, wherein the plurality of channels 176 are oriented generally perpendicularly to the diaphragm assembly 106, are open at ends facing the diaphragm assembly 106, and are closed at ends facing away from the diaphragm assembly 106. In a further embodiment the enclosure 170 comprises a porous material 178 as illustrated in FIG. 8.

Figure 9:
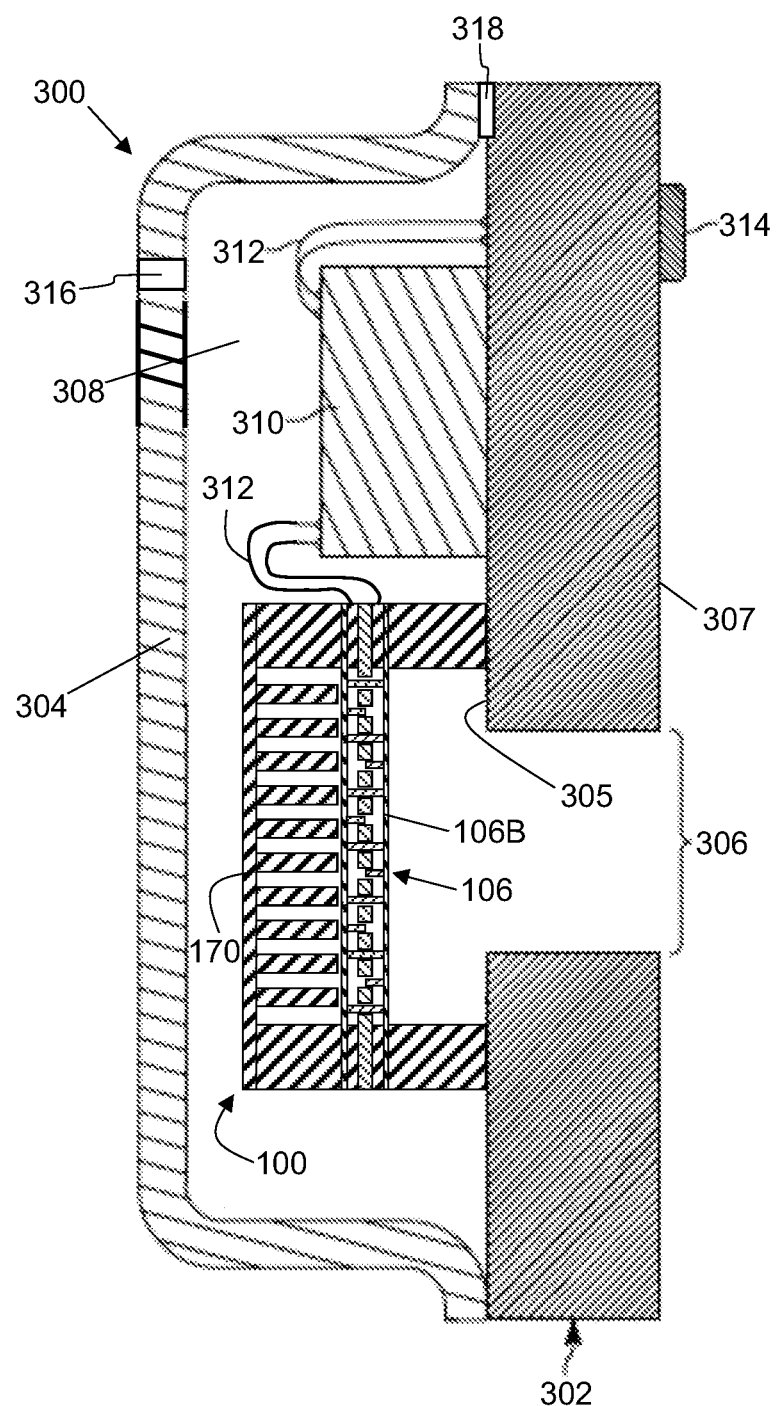
FIG. 9 is a cross-sectional view of a microphone assembly according to an embodiment.

Turning to FIG. 9, an embodiment of the MEMS die 100 is used as an acoustic transducer 100 and configured to fit within a microphone assembly, generally labeled 300. The assembly 300 includes a housing including a base 302 having a first surface 305 and an opposing second surface 307. The housing further includes a cover 304 (e.g., a housing lid), and an acoustic port 306. In an embodiment the port 306 extends between the first surface 305 and the second surface 307. In one implementation, the base 302 is a printed circuit board. The cover 304 is coupled to the base 302 (e.g., the cover 304 may be mounted onto a peripheral edge of the base 302). Together, the cover 304 and the base 302 define an interior of the housing having an enclosed volume 308. The acoustic transducer 100 including the diaphragm assembly 106 and the enclosure 170 is disposed within the interior of the housing such that the second diaphragm 106B is over the port 306 and the enclosure 170 is over the diaphragm assembly 106.

As shown in FIG. 9, the acoustic port 306 is disposed on the base 302 and is structured to convey sound waves to the MEMS acoustic transducer 100 located within the enclosed volume 308. In some embodiments, the assembly 300 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 300 includes an electrical circuit disposed within the enclosed volume 308. In an embodiment, the electrical circuit includes an integrated circuit (IC) 310. In an embodiment the IC 310 is disposed within the interior of the housing, for example, on the first surface 305 of the base 302, and is electrically connected to the diaphragm assembly 106. The IC 310 may be an application specific integrated circuit (ASIC). Alternatively, the IC 310 may include a semiconductor die integrating various analog, analog-to-digital, and/or digital circuits. In an embodiment the cover 304 is disposed over the first surface 305 of the base 302 covering the MEMS acoustic transducer 100 and the IC 310.

The portion of enclosed volume 308 between the cover 304 and the outer surface of MEMS transducer 100 is not acoustically active. The cover 304 is typically soldered in a region around its periphery to the base 302 which would cause the pressure within the portion of enclosed volume 308 to increase dramatically during soldering. To prevent solder from being blown out of the soldered region, in an embodiment the cover 304 includes a vent hole 316 to the outside atmosphere and/or the soldered region is discontinuous, for example, having one or more openings 318 disposed therethrough so that air can escape between the cover 304 and the base 302

In the assembly 300 of FIG. 9, the MEMS acoustic transducer 100 is illustrated as being disposed on the first surface 305 of the base 302. The MEMS acoustic transducer 100 converts sound waves, received through acoustic port 306, into a corresponding electrical microphone signal, and generates an electrical signal (e.g., a voltage) at a transducer output in response to acoustic activity incident on the port 306. As shown in FIG. 9, the diaphragm assembly 106 is electrically connected to the electrical circuit via one or more bonding wires 312. The assembly 300 of FIG. 9 further includes electrical contacts, shown schematically as contacts 314, typically disposed on a bottom surface of the base 302. The contacts 314 are electrically coupled to the electrical circuit. The contacts 314 are configured to electrically connect the assembly 300 to one of a variety of host devices.

Structural aspects of the MEMS die 100 have been described hereinabove. Embodiments of electrical circuitry connected with the MEMS die 100 (and included, for example, within the IC 310) are described hereinbelow.

Figure 10:
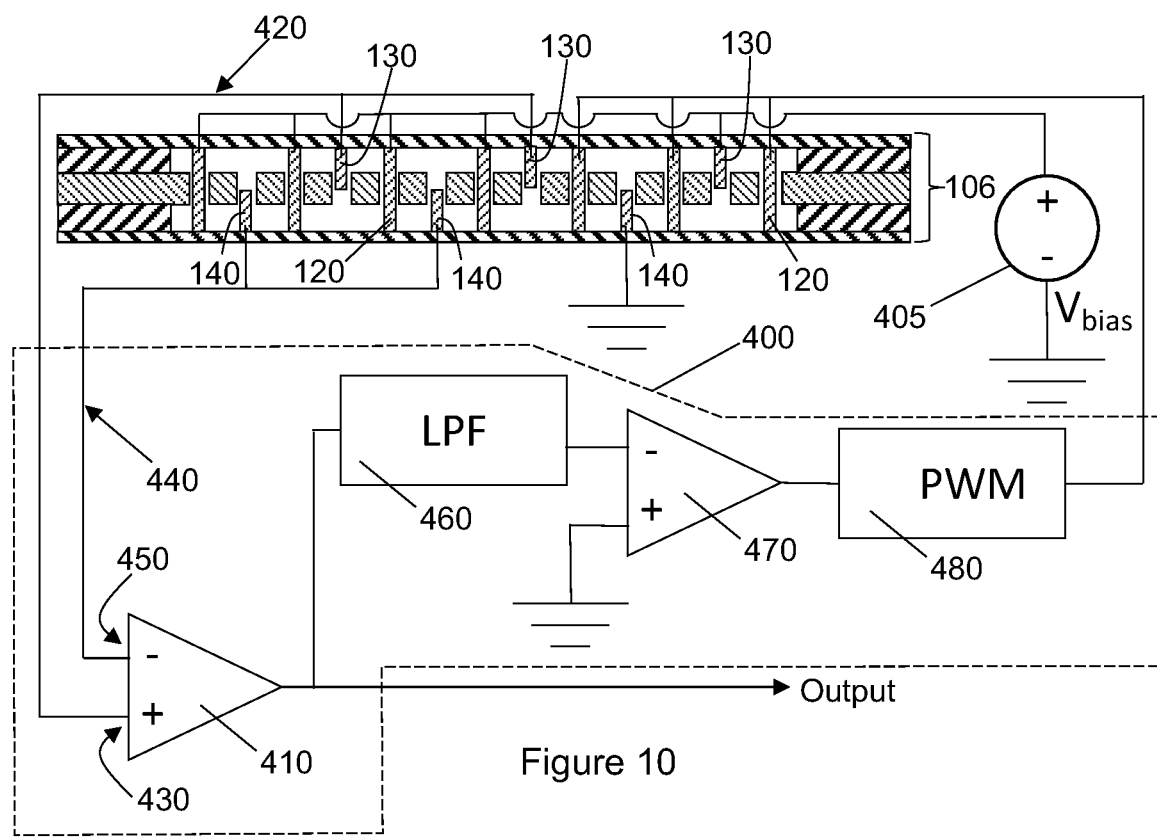
FIG. 10 is an electrical diagram for a first embodiment of a force feedback system.

Referring to FIG. 10, in an embodiment, a voltage source 405 is electrically connected to at least a first subset of the first plurality 120 of electrodes to provide a voltage bias to the first subset of the first plurality 120 of electrodes relative to ground. A force feedback system 400, as shown outlined by the dashed line in FIG. 10, is electrically connected to the diaphragm assembly 106. The force feedback system 400 in an embodiment is an electrical circuit that includes a differential amplifier 410 that receives inputs from electrodes of the diaphragm assembly 106. In particular, in an embodiment, there is a first electrical connection 420 between the first ends 132 of a first subset of the second plurality 130 of electrodes and a first input 430 to the differential amplifier 410. In an embodiment there is also a second electrical connection 440 between the second ends 144 of a first subset of the third plurality 140 of electrodes and a second input 450 to the differential amplifier 410.

Still referring to FIG. 10, in an embodiment the force feedback system 400 further includes a frequency filter circuit 460 (labeled LPF which stands for Low Pass Filter) having an input connected to an output of the differential amplifier 410. The force feedback system 400 includes a feedback amplifier 470 having an input connected to an output of the frequency filter circuit 460. In an embodiment, the force feedback system 400 optionally includes a pulse width modulation (PWM) circuit 480 having an input connected to an output of the feedback amplifier 470 and an output connected to a second subset of the first plurality of electrodes 120 not connected to the voltage source 405. In the absence of the optional PWM circuit 480, the output of the feedback amplifier 470 is directly connected to the second subset of the first plurality of electrodes 120 not connected to the voltage source 405 A second subset of the second plurality 130 of electrodes is connected to the voltage source 405 while a second subset of the third plurality 140 of electrodes is connected to ground.

In operation, a MEMS device incorporating the MEMS die 100 and the force feedback system 400 described in regard to FIG. 10 processes electrical signals produced by motion of the diaphragm assembly 106 while also providing a feedback force to the diaphragm assembly 106. In particular, in an embodiment, motion of the diaphragm assembly 106 produces a voltage signal at the output of the differential amplifier 410. The voltage signal is filtered by the frequency filter circuit 460 to select a portion of the signal below a predetermined frequency. In an embodiment, the predetermined frequency is 35 Hz. In other embodiments any different predetermined frequency as desired can be used, for example, the predetermined frequency could be 10 Hz, 15 Hz, 20 Hz, 25 Hz, 30 Hz, 35 Hz, 40 Hz, 45 Hz, 50 Hz, 55 Hz, 60 Hz, 65 Hz, 70 Hz, 75 Hz, 80 Hz, 85 Hz, 90 Hz, 95 Hz, 100 Hz, any frequency between these listed values, a frequency lower than 10 Hz, or a frequency higher than 100 Hz.

The acoustic low pass frequency determined by the resistance of the pierces 114A and 114B and the effective compliance of the back volume 175 should be lower than that of the predetermined frequency set by the frequency filter circuit 460. The acoustic low pass frequency is typically less than 20 Hz, for example, 10 Hz, 5 Hz, 1 Hz, 0.1 Hz, or 0.01 Hz. By lowering the acoustic low pass frequency, the overall acoustic noise of the MEMS device for example, a microphone is reduced. By using force feedback with a predetermined frequency higher than the acoustic low pass frequency, the microphone output is restricted to the common audio frequency band and potential overload from sub-audible signals is avoided.

The selected portion of the signal is provided to the feedback amplifier 470 and the optional PWM circuit 480 to produce a feedback voltage that is applied to the second subset of the first plurality of electrodes 120. The feedback voltage produces an electrostatic force on the diaphragm assembly 106 that is counter to the force of the pressure. For example, by utilizing a frequency of 35 Hz, large acoustic impulses at frequencies of 35 Hz and below that could potentially overload the diaphragm assembly can be removed via the force feedback provided by the described circuitry.

Figure 11:
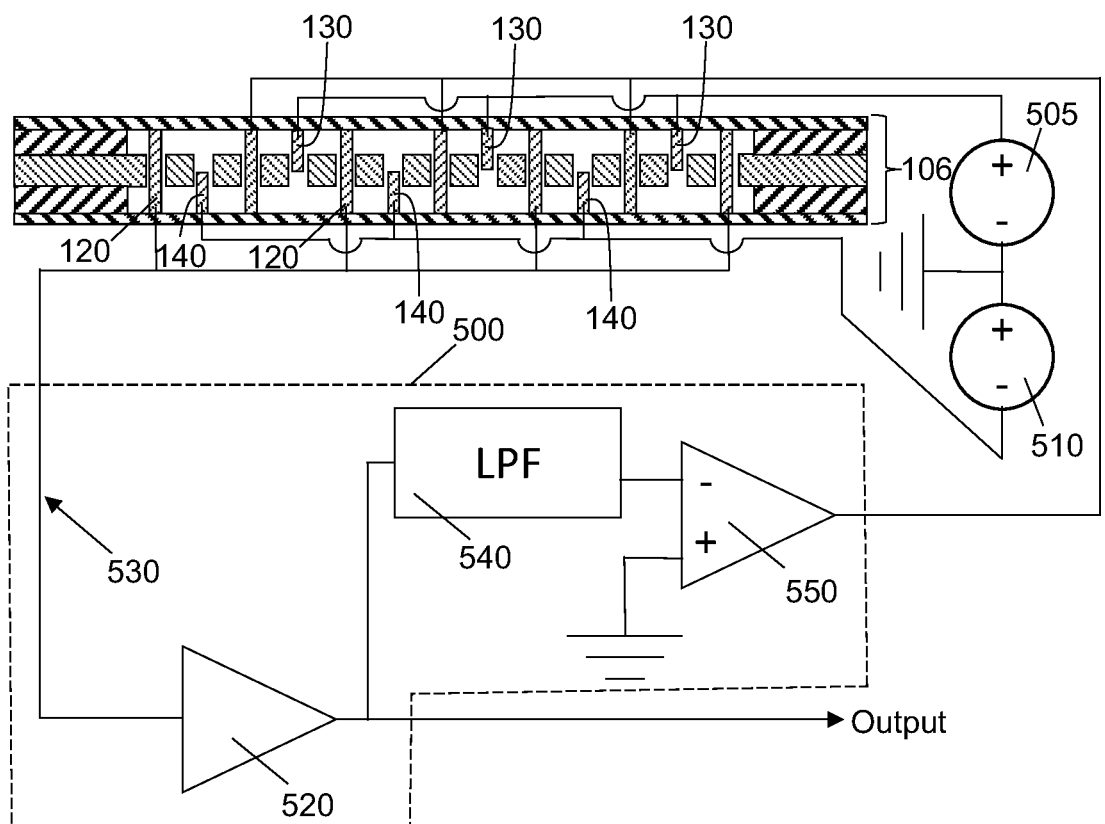
FIG. 11 is an electrical diagram for a second embodiment of a force feedback system.

Referring to FIG. 11, in another embodiment, a force feedback system 500 connected with the MEMS die 100 differs somewhat from the force feedback system 400 described in regard to FIG. 10. In the embodiment shown in FIG. 11, a first voltage source 505 is electrically connected to the first ends 132 of the second plurality of electrodes 130 to provide a voltage bias to the second plurality of electrodes 130 relative to ground. A second voltage source 510 is electrically connected to the second ends 144 of the third plurality of electrodes 140 to provide a voltage bias to the third plurality of electrodes 140 relative to ground. The force feedback system 500 includes a first amplifier 520 that receives inputs from the electrodes of the diaphragm assembly 106. In particular in an embodiment, there is a first electrical connection 530 between at least a first subset of the first plurality of electrodes 120 and an input to the first amplifier 520.

Still referring to FIG. 11, in an embodiment the force feedback system 500 further includes a frequency filter circuit 540 (labeled LPF which stands for Low Pass Filter) having an input connected to an output of the first amplifier 520. The circuitry includes a second amplifier 550 having an input connected to an output of the frequency filter circuit 540. The output of the second amplifier 550 is connected to a second subset of the first plurality of electrodes 120.

In operation, a MEMS device incorporating the MEMS die 100 and the force feedback system 500 described in regard to FIG. 11 processes electrical signals produced by motion of the diaphragm assembly 106 while also providing a feedback force to the diaphragm assembly 106. In particular, the embodiment of the circuit in FIG. 11 functions like the force feedback system 400 described in regard to FIG. 10 by also filtering a voltage signal from the first amplifier 520 to select a portion of the signal below a predetermined frequency, which can be any frequency as described above in regard to FIG. 10.

Again, the selected portion of the signal is provided to the second amplifier 550 to produce a feedback voltage that is applied to the second subset of the first plurality of electrodes 120. The feedback voltage produces an electrostatic force on the diaphragm assembly 106 that is counter to the force of the pressure causing motion of the diaphragm assembly 106.

The components described in the circuitry with regard to FIGS. 10 and 11 are meant only to be examples, and other combinations of components may be used to carry out the force feedback. For example, the amplifiers can be any sort of amplifiers having a gain of unity or otherwise.

Steps in a production process utilized to produce the MEMS die 100 as described hereinabove include etching, masking, patterning, cutting, boring, and/or release steps executed on a workpiece. Accordingly, all of the steps are not described in detail herein. However, generally the portions of the MEMS die 100 that ultimately end up as the space 112 and the back volume 175 are layered onto a workpiece using sacrificial material, or otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) device comprising:
   a diaphragm assembly, comprising:
      a first diaphragm having a first side and a second side;
      a second diaphragm having a first side facing the first side of the first diaphragm and a second side facing away from the first diaphragm, a low pressure region being defined between the first side of the first diaphragm and the first side of the second diaphragm;
      a first plurality of electrodes, each of the first plurality having a first end connected to the first side of the first diaphragm and a second end connected to the first side of the second diaphragm;
      a second plurality of electrodes, each of the second plurality having a first end connected to the first side of the first diaphragm and a free second end;
      a third plurality of electrodes, each of the third plurality having a free first end and a second end connected to the first side of the second diaphragm; and
      a solid dielectric spaced between the first and second diaphragms and including a plurality of apertures,
      wherein each electrode of the first, second, and third pluralities of electrodes is disposed at least partially within an aperture of the plurality of apertures, the dielectric surrounds the second ends of each of the second plurality of electrodes and the first ends of each of the third plurality of electrodes; and
   a force feedback system that receives output from the diaphragm assembly and produces a feedback voltage that is applied to the diaphragm assembly to produce an electrostatic force on the diaphragm assembly that counters a low-frequency pressure across the diaphragm assembly.

2. The MEMS device of claim 1, wherein the feedback system receives the output from a first subset of the first plurality of electrodes and the feedback voltage is applied to a second subset of the first plurality of electrodes to produce the electrostatic force.

3. The MEMS device of claim 1, wherein the feedback system receives the output from a subset of the second plurality of electrodes and a subset of the third plurality of electrodes and the feedback voltage is applied to a subset of the first plurality of electrodes to produce the electrostatic force.

4. The MEMS device according to claim 1, wherein the first, second, and third pluralities of electrodes are movable relative to the solid dielectric.

5. The MEMS device according to claim 1, wherein
at least subsets of the first plurality of electrodes are electrically connected to each other,
at least subsets of the second plurality of electrodes are electrically connected to each other, and
at least subsets of the third plurality of electrodes are electrically connected to each other.

6. The MEMS device according to claim 1, wherein one or more of the second plurality of electrodes is coaxially disposed with one or more of the third plurality of electrodes.

7. The MEMS device according to claim 6, wherein the second end of the one or more of the second plurality of electrodes is connected by a dielectric support layer to the first end of the one or more of the third plurality of electrodes.

8. The MEMS device according to claim 1 further comprising a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

9. The MEMS device of claim 1, further comprising:
an integrated circuit (IC);
a housing comprising:
a base having a first surface, an opposing second surface, and a port;
a cover attached to the first surface of the base, wherein the cover and the base define an interior of the housing,
wherein the port extends between the first surface and the second surface, and the diaphragm assembly is disposed within the interior of the housing such that the second diaphragm is over the port; and
wherein the integrated circuit (IC) is disposed within the interior of the housing and electrically connected to the diaphragm assembly.

10. The MEMS device of claim 9, further comprising a vent selected from the group of vents consisting of a vent hole disposed through the cover, one or more openings disposed between the cover and the base, and combinations thereof.

11. The MEMS device according to claim 1, further comprising an enclosure disposed on a second side of the first diaphragm opposite the first side, the enclosure defining a back volume in which all points within the back volume are less than a single thermal boundary layer thickness from a nearest surface of the enclosure.

12. The MEMS device according to claim 11, wherein the enclosure comprises a back wall disposed generally parallel to the diaphragm assembly and a plurality of elongate pillars extending from the back wall and oriented generally perpendicularly to the diaphragm assembly.

13. The MEMS device according to claim 11, wherein the enclosure comprises a plurality of elongate channels disposed therein, wherein the plurality of channels are oriented generally perpendicularly to the diaphragm assembly, are open at ends facing the diaphragm assembly, and are closed at ends facing away from the diaphragm assembly.

14. The MEMS device according to claim 11, wherein the enclosure comprises a porous material.

15. The MEMS device according to claim 1, further comprising:
a voltage source electrically connected to at least a first subset of the first plurality of electrodes to provide a voltage bias to the first subset of the first plurality of electrodes relative to ground,
wherein the force feedback system comprises:
a differential amplifier;
a first electrical connection between the first ends of at least a first subset of the second plurality of electrodes and a first input to the differential amplifier; and
a second electrical connection between the second ends of at least a first subset of the third plurality of electrodes and a second input to the differential amplifier.

16. The MEMS device according to claim 15, wherein the force feedback system further comprises:
a frequency filter circuit having an input connected to an output of the differential amplifier; and
a feedback amplifier having an input connected to an output of the frequency filter circuit.

17. The MEMS device according to claim 16, wherein:
an output of the feedback amplifier is connected to a second subset of the first plurality of electrodes not connected to the voltage source; and
motion of the diaphragm assembly in response to pressure produces a voltage signal at an output of the differential amplifier, the voltage signal is filtered by the frequency filter circuit to select a portion of the signal below a predetermined frequency, and the selected portion of the signal is provided to the feedback amplifier to produce a feedback voltage that is applied to the second subset of the first plurality of electrodes, wherein the feedback voltage produces an electrostatic force on the diaphragm assembly counter to the force of the pressure.

18. The MEMS device according to claim 1, further comprising:
a first voltage source electrically connected to the first ends of the second plurality of electrodes to provide a voltage bias to the second plurality of electrodes relative to ground;
a second voltage source electrically connected to the second ends of the third plurality of electrodes to provide a voltage bias to the third plurality of electrodes relative to ground;
wherein the force feedback system comprises:
a first amplifier; and
a first electrical connection between at least a first subset of the first plurality of electrodes and an input to the first amplifier.

19. The MEMS device according to claim 18, wherein:
the force feedback system further comprises a frequency filter circuit having an input connected to an output of the first amplifier, and a second amplifier having an input connected to an output of the frequency filter circuit; and the output of the second amplifier is connected to a second subset of the first plurality of electrodes.

20. A microelectromechanical systems (MEMS) device comprising:
a diaphragm assembly, comprising:
  a first diaphragm having a first side and a second side;
  a second diaphragm having a first side facing the first side of the first diaphragm and a second side facing away from the first diaphragm, a low pressure region being defined between the first side of the first diaphragm and the first side of the second diaphragm;
  a first plurality of electrodes, each of the first plurality having a first end connected to the first side of the first diaphragm and a second end connected to the first side of the second diaphragm;
  a second plurality of electrodes, each of the second plurality having a first end connected to the first side of the first diaphragm and a free second end;
  a third plurality of electrodes, each of the third plurality having a free first end and a second end connected to the first side of the second diaphragm; and
  a solid dielectric spaced between the first and second diaphragms and including a plurality of apertures,
  wherein each electrode of the first, second, and third pluralities of electrodes is disposed at least partially within an aperture of the plurality of apertures, the dielectric surrounds the second ends of each of the second plurality of electrodes and the first ends of the each of the third plurality of electrodes;
a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

21. The MEMS device according to claim 20, further comprising:
  a voltage source electrically connected to at least a first subset of the first plurality of electrodes to provide a voltage bias to the first subset of the first plurality of electrodes relative to ground;
  a force feedback system comprising:
    a differential amplifier;
    a first electrical connection between the first ends of at least a first subset of the second plurality of electrodes and a first input to the differential amplifier;
    a second electrical connection between the second ends of at least a first subset of the third plurality of electrodes and a second input to the differential amplifier;
    a frequency filter circuit having an input connected to an output of the differential amplifier; and
    a feedback amplifier having an input connected to an output of the frequency filter circuit and an output connected to a second subset of the first plurality of electrodes not connected to the voltage source;
  wherein
  motion of the diaphragm assembly in response to pressure produces a voltage signal at an output of the differential amplifier, the voltage signal is filtered by the frequency filter circuit to select a portion of the signal below a predetermined frequency, the selected portion of the signal is provided to the feedback amplifier to produce a feedback voltage that is applied to the second subset of the first plurality of electrodes, wherein the feedback voltage produces an electrostatic force on the diaphragm assembly counter to the force of the pressure.

22. The MEMS device according to claim 21, wherein the predetermined frequency is about 35 Hz.

* * * * *